United States Patent
Pineda De Gyvez et al.

(10) Patent No.: US 7,477,110 B2
(45) Date of Patent: Jan. 13, 2009

(54) METHOD AND DEVICE FOR TESTING A PHASE LOCKED LOOP

(75) Inventors: Jose De Jesus Pineda De Gyvez, Eindhoven (NL); Alexander Guido Gronthoud, Eindhoven (NL); Cristiano Cenci, Castel de Piano (IT)

(73) Assignee: NXP B.V., Eindhoven (NL)

( * ) Notice: Subject to any disclaimer, the term of this patent is extended or adjusted under 35 U.S.C. 154(b) by 138 days.

(21) Appl. No.: 10/588,939

(22) PCT Filed: Jan. 27, 2005

(86) PCT No.: PCT/IB2005/050343
§ 371 (c)(1),
(2), (4) Date: Aug. 8, 2006

(87) PCT Pub. No.: WO2005/078464
PCT Pub. Date: Aug. 25, 2005

(65) Prior Publication Data
US 2007/0132525 A1 Jun. 14, 2007

(30) Foreign Application Priority Data
Feb. 13, 2004 (EP) .................................. 04100593

(51) Int. Cl.
*G01R 31/02* (2006.01)
(52) U.S. Cl. .................... 331/44; 331/34; 331/185; 324/537; 324/763; 324/771
(58) Field of Classification Search .................. 331/14, 331/18, 34, 44, 185, 186; 324/537, 763, 324/765, 771, 76.12, 76.15, 76.53; 327/156, 327/157
See application file for complete search history.

(56) References Cited

U.S. PATENT DOCUMENTS
7,023,230 B1 * 4/2006 Allen et al. ................. 324/763

OTHER PUBLICATIONS

Dalmia, M. et al., "Power Supply Current Monitoring Techniques for Testing PLLs", Test Symposium, 1997. (ATS '97) Proceedings., Sixth Asian, Nov. 1997, pp. 366-371.*
Shyam S. Somayajula et al. :"Analogue Fault Diagnosis Based on Ramping Power Supply Current Signature Clusters"; IEEE Transactions on Circuits and Systems: Analouge and Digital Signal Processing, vol. 43, No. 10; Oct. 1996 pp. 703-712.

* cited by examiner

*Primary Examiner*—Robert J. Pascal
*Assistant Examiner*—Ryan J. Johnson
(74) *Attorney, Agent, or Firm*—Peter Zawilski

(57) ABSTRACT

According to an example embodiment, there is a testing device for testing a phase locked loop having a power supply input. The testing device comprises a power supply unit for providing a power supply signal $V_{DD}$ having a variation profile to the power supply input of the phase locked loop, wherein a width and height of said variation profile are formed in such a way, that the voltage controlled oscillator is prevented from outputting an oscillating output signal. There is a means for disabling a feedback signal to a phase comparator of the phase locked loop such that said phase locked loop is operated in an open loop mode, and a meter for measuring a measurement signal of the phase locked loop, while said power supply signal is provided to the power supply input.

18 Claims, 6 Drawing Sheets

METHOD AND DEVICE FOR TESTING A PHASE LOCKED LOOP

The present invention relates to a method and device for testing the phase locked loop (PLL).

A conventional phase locked loop (PLL) is shown in FIG. 1. The purpose of a phase locked loop is to synchronize an output signal $V_{out}$ with a reference signal $V_{ref}$. $V_{ref}$ designates the reference signal and the output signal is called $V_{out}$ in FIG. 1. The purpose of the PLL circuit in FIG. 1 is to provide an output signal $V_{out}$ having a fixed frequency relationship with regard to the reference signal $V_{ref}$. The desired frequency relationship between the frequency $f_{ref}$ of the reference signal $V_{ref}$ and the frequency $f_{out}$ of the output signal is the following:

$$f_{out} = N * f_{ref} \quad (1)$$

where N is a real number, which represents the frequency relationship between the output signal $V_{out}$ and the reference signal $V_{ref}$.

A conventional phase locked loop shown in FIG. 1 comprises a phase detector, a loop filter, a voltage controlled oscillator VCO as well as a frequency divider 1/N. There are several known implementations of phase locked loops that do not conform to the phase locked loop shown in FIG. 1, in particular phase locked loops having proportional and integral charge pumps are well known. The phase detector of FIG. 1 detects a phase difference between a reference input $V_{ref}$ and a feedback input $V_{fb}$. The output of the phase detector is fed to the loop filter. The loop filter filters high frequency components of the output $V_e$ of the phase detector and provides the filter output to the voltage-controlled oscillator VCO. The oscillator control voltage $V_{VCO}$ determines the frequency of the periodic output voltage $V_{out}$ of the voltage-controlled oscillator. The output of the voltage-controlled oscillator constitutes the output signal of the phase locked loop. The output $V_{out}$ is fed to the phase detector via the frequency divider 1/N. Therefore, the feedback input $V_{fb}$ has a frequency equal to 1 divided by N of the output voltage.

PLL systems are traditionally tested using functional specifications, where the functionality of the circuit is verified by some pre-specified test points. A complete functional test includes measuring several parameters, such a locking time, locking-frequency range, capture-frequency range and transfer functions. However, measuring all relevant parameters of the phase locked loop would concur a very high cost. A complete functional testing of an integrated phase locked loop PLL is economically unpractical for production stage testing. Thus, manufacturers usually perform only a selected number of tests.

The frequency locked test is one of the most widely used tests. It verifies a PLL's primary functionality of providing a frequency relationship according to equation 1 by observing the output frequency $f_{out}$ in the locked state for a given reference input frequency $f_{ref}$. Manufacturers can implement this test by measuring the output frequency $f_{out}$ with a time interval analyser. However, this type of frequency measurement suffers from low throughput and usually requires specific test equipment to achieve reliable results. In addition, it requires PLL to be in a locked state, which also significantly reduces the test throughput.

An alternative approach to functional testing is fault based testing. In this case physical defects in a phase locked loop are targeted. The effect of common defects on the functioning of the PLL-circuit is known a priori through fault simulation. Faults can be catastrophic or parametric. The fault based test methods aims at identifying common defects in analogue circuits.

Another fault-based method is the supply current monitoring technique. This technique is based on the observation of a power supply current for fault diagnosis. The method requires the measurement of power supply currents and power voltage signals. Furthermore, errors caused by soft faults must be identified. The publication "Analogue Fault Diagnosis Based on Ramping Power Supply Current Signature Clusters" by Shyam S. Somayajula et all. in IEEE Transactions on Circuits and Systems: Analogue and Digital Signal Processing, Vol. 43, No. 10, October 1996 proposes a method for fault diagnosis of analogue circuits based on the observation of power supply currents. In order to obtain signature information for sufficient diagnosis, the transistors in the circuit are forced to operate in all possible regions of operation. To this end, a ramp signal instead of the conventional DC signal or ground voltage is applied to the power supply of the circuit. The obtained supply current signatures are then clustered in different groups using a kohonen neural network classifier. This method has the potential of detecting single and multiple short circuits as well as open circuits.

The application of the method to PLL-circuits poses several specific problems. The loop design has the effect, that the recurring adaptation of the phase locked loop during the ramping of its power supply continuously changes the measured power supply signatures. Furthermore, the oscillations of the voltage controlled oscillator show up in general in the current signature of the power supply current. The presence of the oscillations makes testing more difficult, since there are two values (peak and valley of the signal) to test, rather than one. The frequency of oscillation of the voltage controlled oscillator changes during the adaptation of the phase locked loop to an input clock signal.

It is therefore object of the present invention to provide a method for testing a phase locked loop (PLL) that solves the problems associated with the analogue fault diagnosis based on ramping power supply current signatures according to the state of the art.

The problem is solved by a method for testing a phase locked loop (PLL) having a power supply input. The method comprises the step of operating the phase locked loop in open loop mode. A phase locked loop is operated in an open loop mode, if the output $U_{out}$ of the voltage controlled oscillator 14 of a phase locked loop is not fed to the phase comparator 10 via a frequency divider 16 of the phase locked loop. The next step consists of providing a power supply signal ($V_{DD}$) having a variation profile to the power supply input of the phase locked loop. The width and height of said variation profile is formed in such a way that the voltage-controlled oscillator is prevented from outputting an oscillating output signal ($U_{out}$). The phase locked loop and in particular the voltage controlled oscillator require certain amount of time in order to react to the power supply. If the width of the variation profile of the power supply signal is small, then the power supply signal is too short to activate the phase locked loop. Hence, the voltage-controlled oscillator does not output an oscillating output signal. Therefore, no oscillations appear in measurement signals in particular in the power supply current of the phase locked loop. The waveform of the measured signal is repeatable and has unique properties. Finally the measured signal is compared to a template signal. In this case, the evaluation of the measured signal is a simple task, since no oscillations appear therein. The shape and property of the measured signal may correlate more easily to defects. The defects are determined, if the measured signal deviates in a predetermined way from the template signal. A step further for testing is to identify a reduced set of specific test points in the template signal to avoid comparing faulty and template signals point-to-point. The latter approach is particularly useful for production testing.

The variation profile of the power supply signal has an ascending edge to energize the circuit. It also has a plateau region short enough to prevent the voltage-controlled oscillator from outputting an oscillating output signal. The variation profile also has a descending edge. This descending edge forces the majority of the transistors to operate in all regions of operation. The variation profile corresponding to the maximum value of the power supply signal is usually or preferably made to correspond to the regular power supply voltage for operating the phase locked loop.

The phase locked loop regularly comprises a phase comparator. The phase comparator has a feedback input ($U_{fb}$) and a reference input ($U_{ref}$). Preferably, both the feedback input and the reference input are connected to ground. In this setup the phase comparator remains static as no feedback input is applied. Only the analogue circuitry of the phase locked loop is active. Alternatively, both feedback input ($U_{fb}$) and the reference input ($U_{ref}$) may receive an identical periodic input signal. The feedback input is not fed from the output signal of the voltage-controlled oscillator. Therefore, the phase locked loop is operated in an open loop mode. Since the signals received by the phase comparator are identical, no phase difference is detected. Nevertheless, the phase comparator is actively comparing the input signals with each other. Therefore, faults or defects of the phase locked loop may be detected.

The different signals of the phase locked loop may be measured in order to test the phase locked loop. In particular, a current provided to the power supply input ($I_{DD}$) may be used for this purpose. Alternatively, the output voltage $U_{out}$ and/or the oscillator control voltage ($U_{vco}$) of the phase locked loop may be measured. The above-mentioned measurement signals are the most preferred signals, but other signals may also be considered.

Preferably, the power supply signal constitutes a periodic voltage signal. The variation profile of the power supply signal is repeated periodically over time. The width of the variation profile constitutes the period of the periodic voltage signal. The period is the time interval required for a phenomenon to complete a cycle and begin to repeat itself. In this way, the measurement signal may be detected during plural time slots in which the variation profile of the power supply signal is provided to the phase locked loop. The resulting measurement signals may be statistically evaluated.

The periodic power supply signal $V_{DD}$ and the periodic input signal to the reference input $U_{ref}$ are preferably chosen to have the same frequency. The two signals may be phase shifted. The phase difference between the periodic power supply signal $V_{DD}$ and the periodic input signal is preferably equal to 0, T/4 or 3T/4. T represents the period of both periodic signals. In case of the T/4-phase shift, both digital and analogue circuits are continuously excited during testing of the phase locked loop. The T/4-phase shift (25% shift) has as advantages the effect, that the clock pulse of the reference signal is observed in the measured power supply current as an additional spike. The 3T/4-phase shift has the advantage of allowing to observe both the rising and falling edges of the input reference signal, as two additional spikes show up in the measured supply current.

Preferably, for off-chip measurements the testing device comprises a low pass filter for filtering the current ($I_{DD}$) provided to the power supply input that eliminates undesired ripples due to bonding wire inductances. The "cleaned" current can then be compared against the template current to test the presence of a fault in the PLL.

Preferably, the testing device comprises a high pass filter for filtering the current ($I_{DD}$) provided to the power supply input, and an integrator for integrating the filtered power supply current ($I_{DD}$). The integrated power supply current is indicative of a defective phase locked loop. Faults in the phase locked loop may appear as ripples in the power supply current. The ripples are high frequency components of the power supply current. The high pass filter is adapted to suppress low frequency components and transmit high frequency components in particular the ripples. The output of the high pass filter is integrated for a predetermined period of time. The resulting integrated signal is indicative of the ripples. Consequently, faults may be detected by observing the signal output by the integrator. The integrator may yield a reference voltage against which faulty voltages are compared.

Preferred embodiments of the present invention are described herein after with reference to the accompanied drawings. The preferred embodiments are only exemplary and represent specific implementations of the present invention; the scope of protection is not restricted by the preferred embodiments. The invention is defined by the appended claims.

Figure 1:
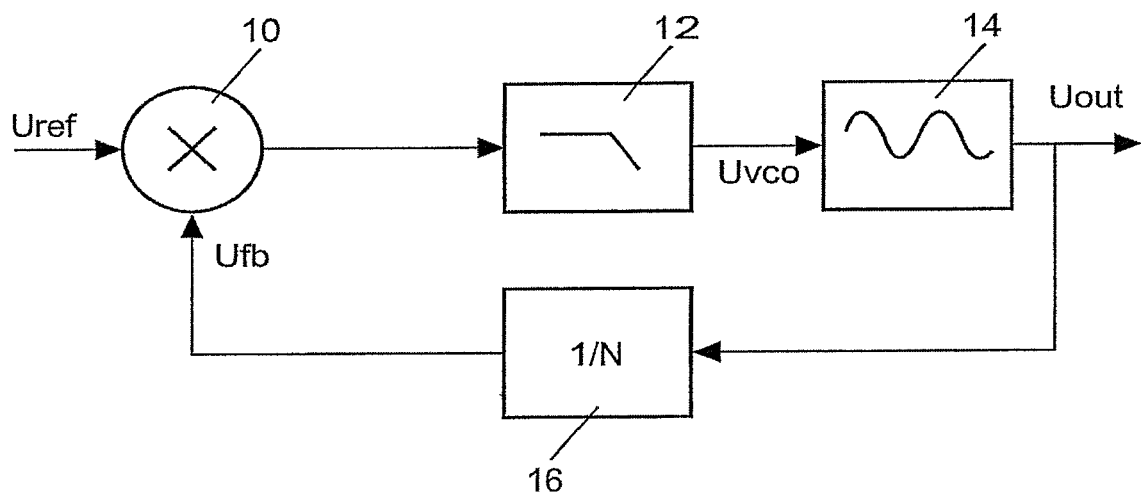
FIG. 1 shows a conventional phase locked loop circuit.

FIG. 1 shows a conventional phase locked loop circuit (PLL-circuit). There are several known implementations of phase locked loops that do not conform to the phase locked loop shown in FIG. 1, in particular phase locked loops having proportional and integral charge pumps are well known. The circuit comprises a phase comparator 10, a loop filter 12, a voltage controlled oscillator (VCO) 14 as well as a frequency divider 16. The phase comparator 10 receives a reference signal $U_{ref}$ and a feedback $U_{fb}$. Both the reference signal $U_{ref}$ as well as the feedback signal $U_{fb}$ are periodic signals. The phase comparator 10 determines the phase difference between the reference signal $U_{ref}$ and the feedback signal $U_{fb}$ and outputs a signal proportional to said phase difference to the loop filter 12. The loop filter is a low pass filter. The loop filter suppresses high frequency components of said output signal from the phase comparator 10. The output of the loop filter is fed to the voltage-controlled oscillator. The output of the loop filter is a voltage $U_{VCO}$. The voltage-controlled oscillator 14 generates an output signal $U_{out}$. The output signal $U_{out}$ is a periodic signal having a frequency proportional to the control voltage $U_{VCO}$ to the voltage-controlled oscillator. The output signal of the voltage-controlled oscillator 14 represents the output signal of the phase locked loop. The output signal $U_{out}$ is fed to a frequency divider 16. The output signal of the frequency divider represents the feedback signal to the phase comparator. Its frequency is equal to the frequency of the output signal $U_{out}$ divided by N.

Figure 2:
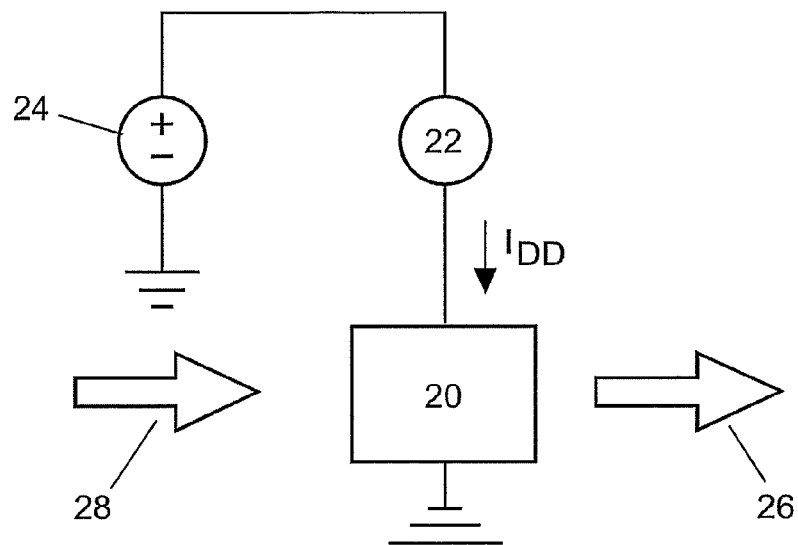
FIG. 2 shows the testing devices well as the phase locked loop according to the first embodiment of the present invention.

FIG. 2 shows a first embodiment of the testing device according to the present invention. The testing device comprises the phase locked loop 20 of FIG. 1, a voltage generator 24 and a current meter 22. The voltage generator 24 is connected via the current meter 22 to the power supply input of the phase locked loop 20. $I_{DD}$ represents the current supply to the power supply input of the phase locked loop 20. Reference sign 28 represents the signal input to the phase locked loop during testing and reference sign 26 represents the output signal from the phase locked loop. During testing the phase locked loop 20 is operated in the open loop mode. This means, that the output signal 26 from the phase locked loop is not fed back to the phase comparator 10 via the frequency divider 16. This may be achieved by disconnecting the line between the frequency divider 16 and the phase comparator 10.

Figure 3:
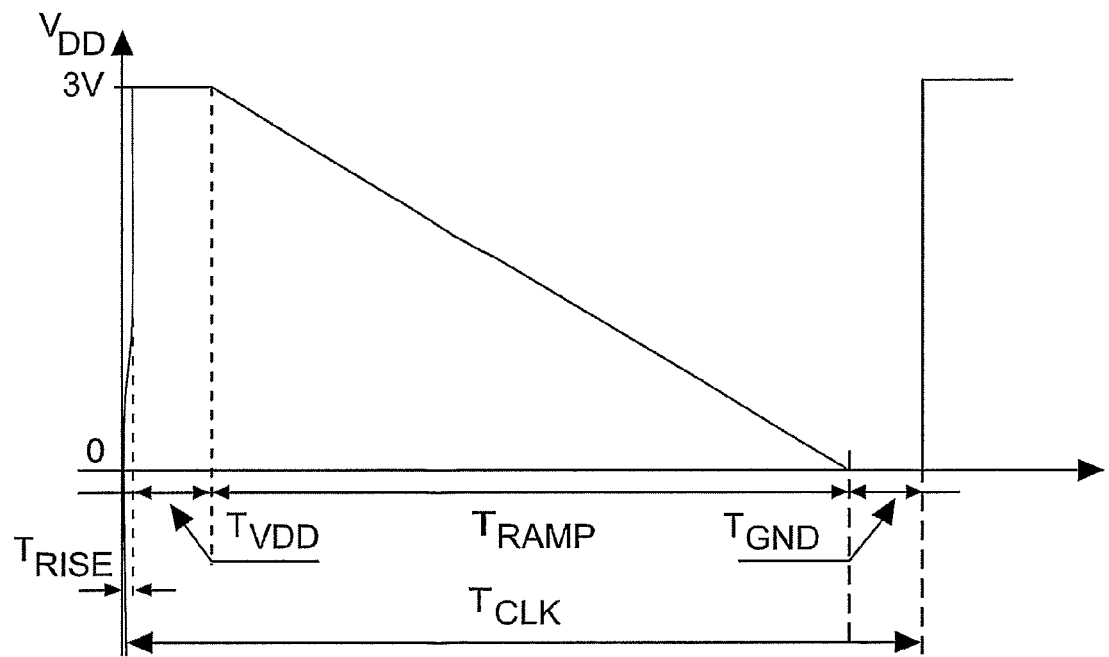
FIG. 3 shows a variation profile of the power supply signal used in the embodiment of FIG. 2.

FIG. 3 shows in detail a variation profile of the power supply signal $V_{DD}$ supplied to the power supply input of the phase locked loop 20 in FIG. 2 during testing. The power supply is gradually increased from 0 to the nominal supply voltage during the rise time $T_{rise}$. The peak of the variation profile lies at the nominal supply voltage in FIG. 3, which represents the regular power supply voltage for the phase locked loop in FIG. 2. The regular supply voltage is fed to the phase locked loop 20 during the time interval $T_{VDD}$. Thereafter, the voltage is linearly decreased until it reaches 0. This is done during the ramp time $T_{RAMP}$. The ramp time $T_{RAMP}$ is considerably longer than the rise time and the time interval $T_{VDD}$. $T_{GND}$ represents the time interval during which the voltage supply to the phase locked loop 20 is equal to 0. $T_{CLK}$ represents the width of the variation profile. Since the variation profile of the voltage supply $V_{DD}$ is provided repeatedly to the phase locked loop 20, the width of the variation profile represents a period of the periodic power supply signal. The rise time $T_{RISE}$ as well as the level time $T_{VDD}$ must be short enough to just prevent the voltage-controlled oscillator from starting. This property is needed because otherwise the oscillations will appear in the supply current $I_{DD}$. The presence of these oscillations would make the testing more difficult. The ramp time $T_{RAMP}$ forces all transistors to go into various regions of operation, e.g. saturation, linear, sub-threshold and cut-off.

Figure 4:
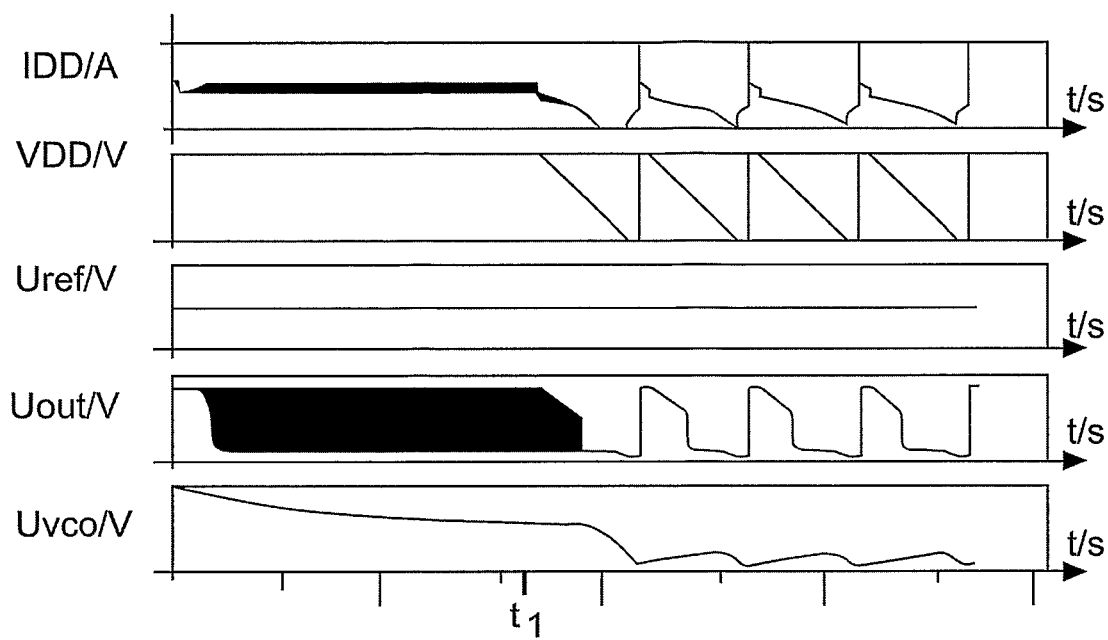
FIG. 4 shows the response of measurement signals to the power supply signal in the first embodiment.

FIG. 4 shows five graphs of measurement signals during testing versus time. The x-coordinate of each of the graphs is time t. The time is measured in seconds. The first graph represents the power supply current $I_{DD}$. The second graph from the top represents the power supply voltage $V_{DD}$ supplied by the voltage generator 24 to the phase locked loop 20. The third graph from the top shows the reference voltage $U_{ref}$ supplied to the phase comparator 10. The fourth graph represents the output voltage $U_{out}$ output from the phase locked loop. The fifth graph represents the control voltage $U_{VCO}$ supplied to the voltage-controlled oscillator 14 in FIG. 1.

The constant power supply voltage $V_{DD}$ is supplied to the phase locked loop for a short time interval. The reference voltage supplied to the phase locked loop $U_{ref}$ is equal to 0 during the whole measurement process. As long as the constant power supply voltage is supplied to the voltage-controlled oscillator, the control voltage $U_{VCO}$ to the voltage-controlled oscillator gradually decreases. The output voltage $U_{out}$ in FIG. 4 appears to be a black bar. The reason for this appearance is, that the oscillation of the output voltage is very fast and cannot be resolved on the time scale. As long as a constant power supply voltage $V_{DD}$ is supplied to the phase locked loop 20, the output voltage $U_{out}$ of the phase locked loop is a high frequency signal. The supply current $I_{DD}$ in FIG. 4 also appears to be a relatively narrow black bar for the same time interval. The oscillation of the output voltage $U_{out}$ has repercussions on the current supply to the phase locked loop.

At approximately time t1, the variation profile of FIG. 3 is supplied to the phase locked loop 20 periodically. Once the supply voltage $V_{DD}$ has fallen to a predetermined value, the output voltage $U_{out}$ stops oscillating in the previous manner. The output voltage $U_{out}$ takes on the frequency of the power supply $V_{DD}$. Consequently, the repercussions of the previous fast oscillations of the voltage controlled oscillator do not show up in the supply current $I_{DD}$. The supply current $I_{DD}$ has a desired waveform because of its repeatability and uniqueness.

Figure 5:
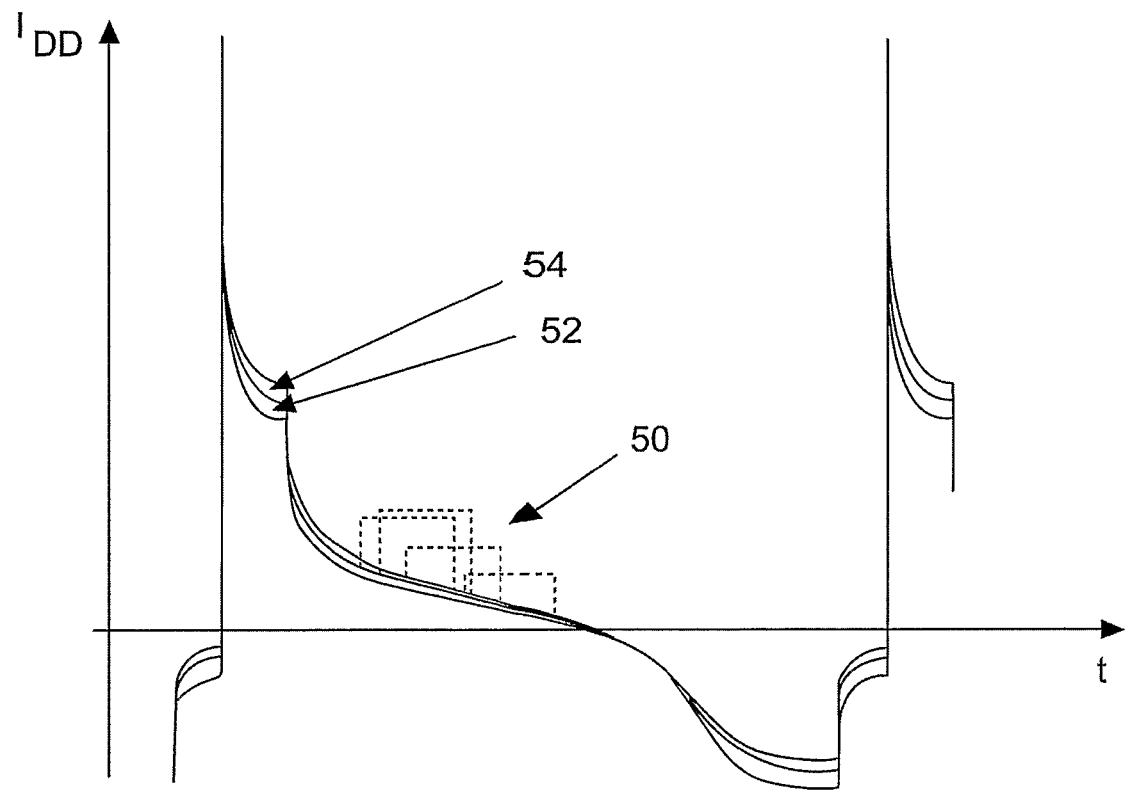
FIG. 5 shows in detail the current $I_{DD}$ provided to the power supply input in close-up.

FIG. 5 shows a close up of the waveform of the supply current $I_{DD}$ to the phase locked loop. In particular, three $I_{DD}$-curves are shown simultaneously in FIG. 5. They have the following main characteristics:

Initially, a main strong spike or peak occurs followed by a discharge area. After the peak a fast discharge of the circuit occurs during the period, in which the supply voltage $V_{DD}$ is equal to the nominal value. The peak is because of the short circuit current of the digital circuits of the PLL during the initial ramp up of the power supply voltage. The discharge is the trend of the circuit to stabilize the power supply current to the normal value. In this part the current is relative invariant with respect to the variability of the fabrication process. There upon a step occurs in the $I_{DD}$ current, as the power supply voltage $V_{DD}$ is gradually decreased. Then the $I_{DD}$-current decreases with a slow slope. The exponentially decaying waveform is due to the discharge of all energy-storage elements of the circuit. This region is bounded until the $I_{DD}$-current crosses the 0 value and becomes negative. In this region the current, as a result of the fabrication process corners, are more separated and different events can be distinguished. In the region, where the power supply current $I_{DD}$ has negative values, the discharging current curves cross each other to establish the same behaviour for negative current values, where the fast process generates the highest current. Furthermore, extra spikes indicative of faults occur for the fast process signature because of the higher amount of current passing through the PLL. Finally, a step occurs in the negative $I_{DD}$-region. This region corresponds to the part of the power supply voltage $V_{DD}$ being equal to 0 Volt. The trend of the current $I_{DD}$ is to charge the circuit up to 0 A, when a new strong spike occurs due to the next $V_{DD}$ ramp. The fast process also in this region generates more current on the charging of the circuit discharging. Reference sign 52 denotes the course of the nominal power supply current $I_{DD}$ and reference sign 54 denotes a power supply current deviating from this course. The differences between the power supply currents are used for determining whether the phase locked loop is working properly. Test points are values of the measured current signal $I_{DD}$ at a certain point in time, which are used for determining the functioning of the PLL circuit. The selection of test points is done in the regions, where the course of the measured current signals for fast and slow process corners do not differ strongly from each other. In particular, the test point is chosen within the region between the first strong spike and the following discharge region up to the first step of the measured current. A second region for choosing test points is indicated by the reference sign 50. In this region measurable differences between the measured current signature and template signal may be detected.

The nature of the $I_{DD}$-curve may be explained by looking at the RC properties of a generic network. In a RC network, the capacitor C is charged through the resistor by the fast rising edge of the voltage profile shown in FIG. 3. This causes the strong current spike of the $I_{DD}$ signal shown in FIG. 5. When the voltage of the power supply signal $V_{DD}$ gradually decreases during the time T in FIG. 3, the energy stored in the capacitor is given back to the power supply generator 24. This causes the decay of the negative current in FIG. 5 to be directly proportional to the size of the capacitor.

The general course of the supply current $I_{DD}$ is represented by the curves shown in FIG. 5. The first region followed by the large spike and reaching up to the first step in FIG. 5 is identical irrespective of the particular test method being applied. The feasible testing methods may be the following: the reference voltage $U_{ref}$ as well as the feedback voltage to the phase comparator of the phase locked loop are both grounded, as it is the case in FIG. 4. The reference voltage $U_{ref}$ as well as the feedback voltage $U_{fb}$ may both receive a periodic clock signal having the same frequency as the supply voltage $V_{DD}$. The reference voltage as well as the feedback voltage $U_{fb}$ may be phase shifted with regard to the supply voltage $V_{DD}$ by T/4 or 3T/4, T being the period of the periodic signals $V_{DD}$, $U_{ref}$ and $U_{fb}$. The main strong spike corresponding to the rising edge of the voltage supply signal $V_{DD}$ appears identically in all test methods. In the region immediately following the first step of the supply current $I_{DD}$ extra spikes and ripples may appear in the power supply current due to components of the voltage controlled oscillator, in particularly a possible level shifter and its output buffer stage. Indeed, decreasing the $V_{DD}$ power supply voltage makes the inverters work in the linear regions of the voltage transfer characteristic. In such a way both transistors PMOS and NMOS conduct for a very short time and the highest value of power current occurs in the path $V_{DD}$ to ground, whereby the regular spike on all of the $I_{DD}$ current signatures is generated.

Further loading effects may appear in the kind of signature of the supply current $I_{DD}$ shown in FIG. 5. Chip bounding wires introduce an extra inductance. The existence of this effect is one of the most difficult problems to be solved on production testing of integrated circuits for high frequency applications. The main effect is a resident oscillation and strong extra ripples in the current waveform. Consequently, the method according to the present invention as explained in the first embodiment holds as well.

Figure 6:
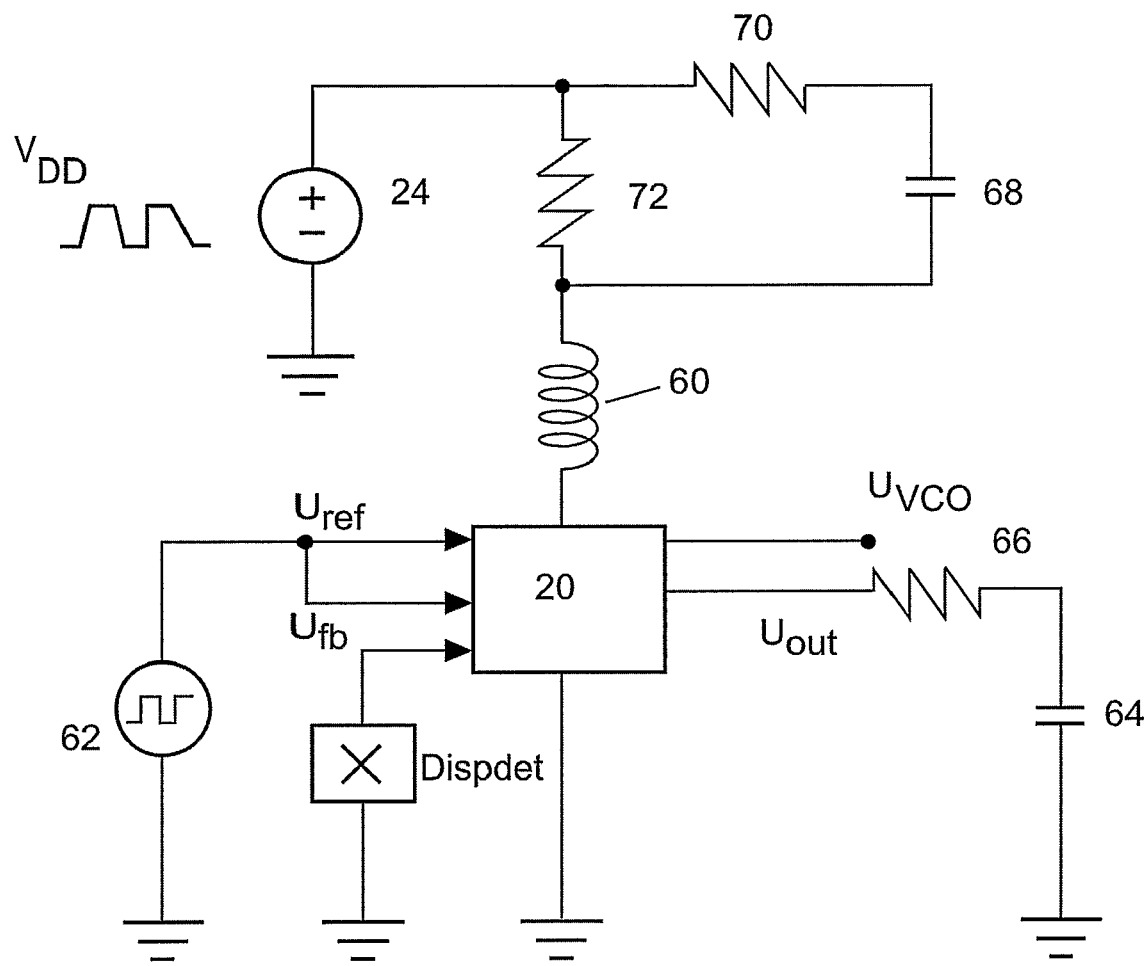
FIG. 6 shows a second testing device according to a second embodiment of the present invention.

FIG. 6 shows a second embodiment of the present invention, which takes account of the aforementioned problem. In FIG. 6 the components corresponding to the features shown in FIG. 2 have the same reference numerals. The phase locked loop under test is designated by reference numeral 20. The voltage generator 24 generates the supply voltage provided to said phase locked loop. The supply voltage presented to the phase locked loop 20 has the same variation profile as presented in FIG. 3. Instead of a simple current meter 22, a low pass filter stage is implemented to process the monitored current supply signal $I_{DD}$. A resistor 70 and capacitor 68 are connected in series to each other. They represent low pass filter stage. The resistor 70 and the capacitor 68 are in turn connected in parallel to the resistor 72. The current flowing through resistor 72 represents the supply current to the phase locked loop. The resistor 72 is inserted in the power supply path by means of which the power supply current $I_{DD}$ is converted and measured as a voltage. The resistor 70 and capacitor 68 represent a first order RC circuit, which implements the low pass filter to remove ripples at a cut off frequency eight times higher than the frequency of the voltage supply signal $V_{DD}$. This cut of frequency is good enough for removing the ripples and extra spikes from the monitored $I_{DD}$ signals. It is evident now that the test measurements are easier due to the clean waveforms. It is evident that due to the presence of strong ripples no measurable test sample can be considered reliable, especially in the regions of interest. The first order RC circuit removes these strong ripples from the test sample, i.e. the supply current $I_{DD}$. Special attention can be paid to the $I_{DD}$ current signatures in case of a 3/4T-test. The 3/4T-test corresponds to the test method in which the reference voltage $U_{ref}$ and feedback voltage $U_{fb}$ are phase shifted by 3T/4 vis-à-vis the supply voltage $V_{DD}$. In this case, the spikes due to the clock edges of the reference voltage $U_{ref}$ reappear as well. In FIG. 6 a clock generator 62 presents the clock signal to the reference voltage input $U_{ref}$ and feedback input of the phase locked loop 20. Furthermore, both the control voltage $U_{VCO}$ of the voltage controlled oscillator as well as the output voltage $U_{out}$ from the voltage-controlled oscillator of the phase locked loop 20 may be measured for testing the phase locked loop 20. A first order RC circuit consisting of resistor 66 and capacitor 64 are provided at the output voltage $U_{out}$ of the phase locked loop 20. This low pass filter is designed to remove ripples from the output voltage $U_{out}$ at a cut off frequency twenty times higher than the frequency of the power supply signal $V_{DD}$.

Figure 7:
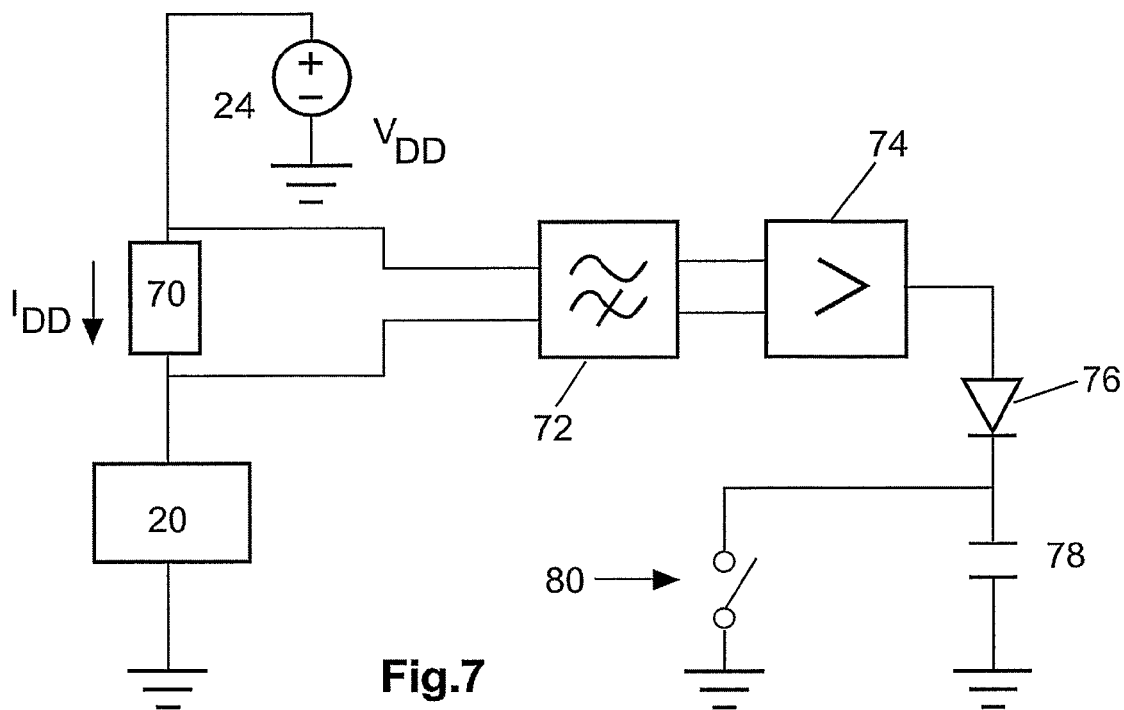
FIG. 7 shows a third testing device according to a third embodiment of the present invention.

FIG. 7 shows a third embodiment of the testing device of the present invention. The reference number 20 in FIG. 7 designates the phase locked loop being tested. The phase locked loop 20 is operated in an open loop mode. A power supply 24 is provided. The power generator 24 is adapted to supply the phase locked loop 20 with the predetermined power supply waveform $V_{DD}$. Defects in the phase locked loop 20 are detected by measuring the power supply current $I_{DD}$ flowing to and from the phase locked loop 20. The power supply current is measured, while the power supply signal with a predetermined variation profile is supplied to the phase locked loop 20. The quiescent supply current $I_{DD}$ of the PLL is measured, since the phase locked loop 20 does not receive an input reference signal $U_{ref}$. A resistor 70 is provided between the power supply 24 and the phase locked loop 20. The power supply current $I_{DD}$ may be detected by measuring the voltage drop across the resistor 70. Said voltage drop is input to a high pass filter 72. The high pass filter is adapted to transmitting high frequency components of the input voltage drop signal. Undesired faults in the phase locked loop usually generate ripples in the measured quiescent power supply current $I_{DD}$. These ripples consist of relatively high frequency components. The filter 72 is adapted to suppress the default power supply current, which does not contain ripples generated from faults in the phase locked loop 20. Only the high frequency ripples indicative of faults in the phase locked loop 20 are transmitted from the high pass filter 72 to an amplifier 74. The amplifier 74 outputs a current signature indicative of the high frequency components of the power supply current $I_{DD}$. The current output from the amplifier 74 is directed across the diode 76 to a capacitor 78. The capacitor 78 is connected in parallel to a switch 80. As long as the switch 80 is open, the current is collected on the capacitor 78. The voltage drop across the capacitor 78 represents an integration of the current from the diode 76. Once the switch 80 is closed, the capacitor 78 is discharged. Therefore, the integration time of the capacitor 78 may be determined by appropriately switching the switch 80. The voltage drop across the capacitor 78 represents a pass-fail signal at the end of the integration If no ripple currents are present in the power supply current $I_{DD}$, then the output of the high pass filter 72 should be approximately 0. Consequently, the integrated current from amplifier 74 should be negligible. The presence of ripples in the power supply current $I_{DD}$ leads to a current flowing to the capacitor 78. The voltage drop across the capacitor 78 is no longer equal to 0. Whenever said voltage drop is measured at the capacitor 78, a defective phase locked loop 20 is present.

Figure 8:
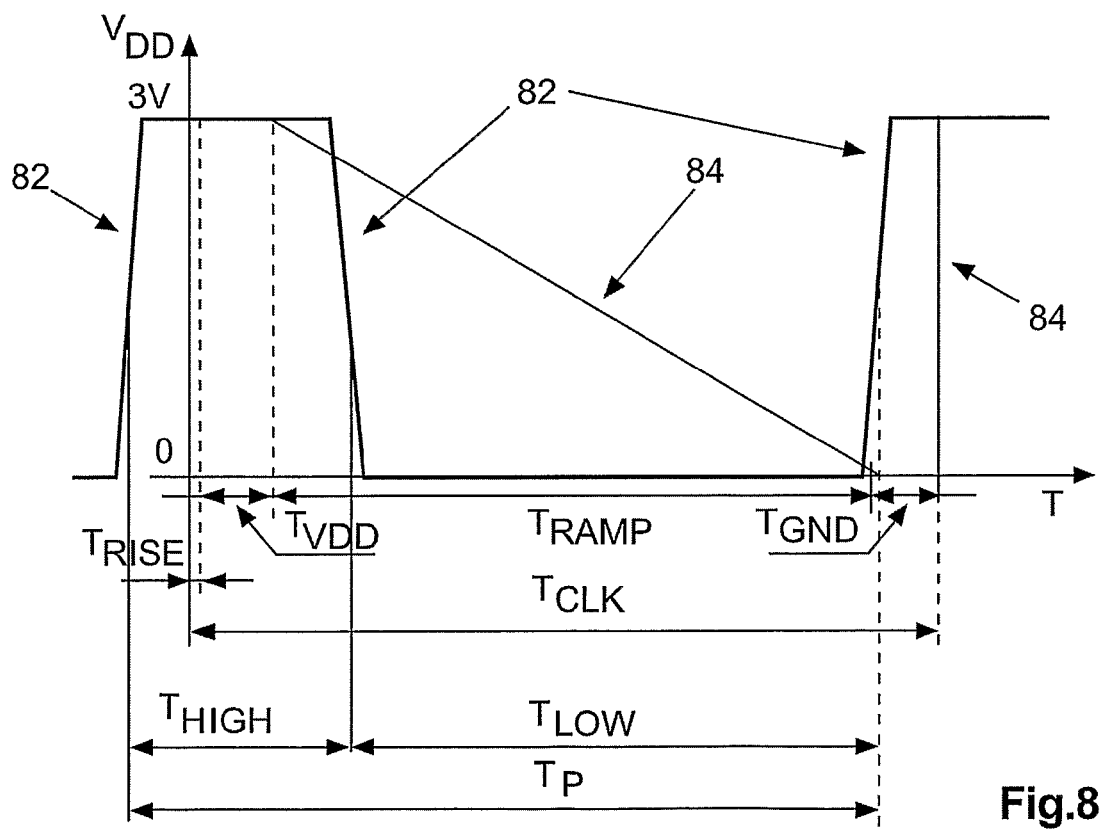
FIG. 8 shows a variation profile of the power supply signal used in the testing device of FIG. 7 as well as a switched test signal used in said embodiment.

FIG. 8 shows a variation profile 84 of the power supply voltage $V_{DD}$ as well as a control signal 82 supplied to the switch 80. The variation profile of the power supply signal $V_{DD}$ in FIG. 8 resembles variation profiles shown in FIG. 3. Therefore, a description of signal 84 is omitted herein. The control signal 82 has a high phase $T_{high}$ and a low phase $T_{low}$. During the high phase, the control signal has a high voltage and the switch 80 is closed. The capacitor 78 is discharged during the time interval $T_{high}$. The switch 80 is open during the low phase of the control signal 82. The ripple currents are integrated by the capacitor 78 during time interval $T_{low}$. The integration by the capacitor 78 takes place during the ramping time $T_{RAMP}$ of the power supply signal $V_{DD}$. The power supply current $I_{DD}$ varies relatively slowly during the time interval $T_{low}$. The integration takes place during the time segments indicated by reference sign 50 in FIG. 5. The regular current supply signal $I_{DD}$ consists of low frequency components, whereas a defective phase locked loop generate high frequency ripples in this area. Therefore, the ripples may be filtered in this area using a high pass filter 72 as shown in FIG. 7.

Figure 9:
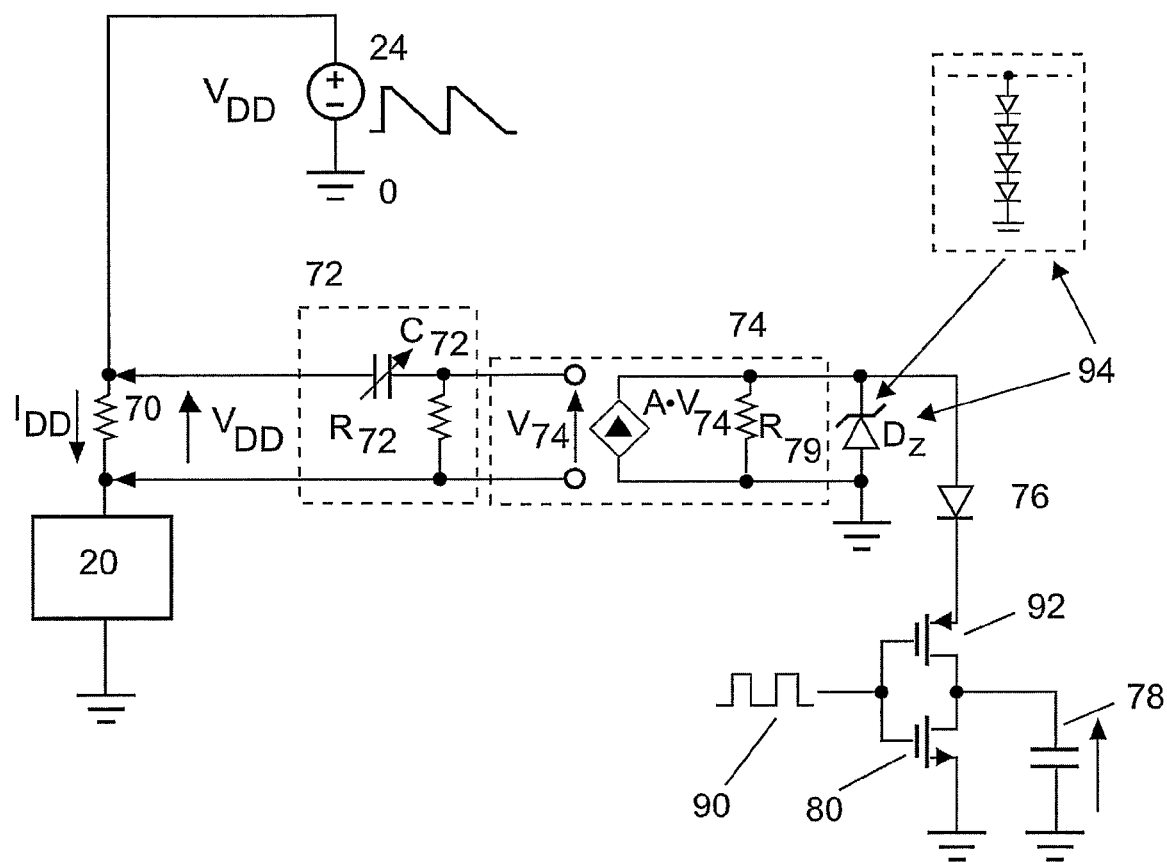
FIG. 9 shows a specific implementation of the embodiment of FIG. 7.

FIG. 9 shows a particular implementation of the testing device in FIG. 7. The same reference signs designate the same components in FIG. 7 and FIG. 9. The high pass filter 22 in FIG. 9 consists of an RC-circuit. The capacitor $C_{72}$ of the high pass filter is tuneable. Therefore, it is possible to tune the filter's corner frequency and also to carry out a spectral analysis of the signals, when the capacitance is swept for various values. Reference sign $V_{74}$ represents both the output signal from the high pass filter 72 as well as the input voltage to the amplifier 74 shown in FIG. 9. The amplifier 74 comprises a voltage generator that is driven by the voltage $V_{74}$. The output voltage is provided across a resistor $R_{79}$. A Z-diode 94 is provided at the output of the amplifier 74. The Z-diode consists of a number of regular diodes, which are reverse biased. The Z-diode is connected to the ground. No current flows through the Z-diode unless the output from the amplifier exceeds the breakthrough voltage of the Z-diode. Therefore, low voltage noise is suppressed by the Z-diode.

The switch 80 in FIG. 9 is a field effect transistor. The gate of said transistor is driven by a control signal 90 indicated in FIG. 9. A second transistor 92 is also driven by the control signal 90. The transistor 92 represents a switch, which is closed, if the switch 80 is open and vice versa. The current from the amplifier 74 is integrated on the capacitor 78, if the control signal 90 is in a low phase. In this state, the switch 92 is open and the switch 80 is closed. If the control signal is in a high phase, then the capacitor 78 is discharged and the transistor 92 blocks the current from the amplifier 74.

The invention claimed is:

1. A testing device for testing a phase locked loop having a power supply input, said testing device comprising:
    a power supply unit for providing a power supply signal having a variation profile to the power supply input of the phase locked loop, wherein a width and height of said variation profile are formed in such a way, that the voltage controlled oscillator is prevented from outputting an oscillating output signal, and wherein a feedback signal, from the voltage controlled oscillator to a phase comparator of the phase locked loop, is disabled such that said phase locked loop is in an open loop mode; and
    a meter for measuring a measurement signal of the phase locked loop, while said power supply signal is provided to the power supply input.

2. The testing device for testing a phase locked loop device according to claim 1, said phase comparator having a feedback input and a reference input, wherein both said feedback input and said reference input are connected to ground.

3. The testing device for testing a phase locked loop according to claim 1, further comprising a periodic signal generator for providing a periodic input signal, wherein the phase comparator has a feedback input and a reference input, and wherein the periodic signal generator provides the periodic input signal to said feedback input and to said reference input.

4. The testing device for testing a phase locked loop device according to claim 1, wherein said meter is adapted to measure at least one of a current provided to the power supply input, an output voltage of the phase locked loop, and an oscillator control voltage of the phase locked loop.

5. The testing device for testing a phase locked loop device according to claim 1, wherein said power supply unit is adapted to provide a periodic power supply signal.

6. The testing device for testing a phase locked loop device according to claim 3, wherein the power supply unit is adapted to provide a periodic power supply signal, and wherein the periodic power supply signal provided by the power supply unit and the periodic input signal provided by the periodic signal generator have the same frequency.

7. The testing device for testing a phase locked loop device according to claim 3, wherein the power supply unit and the periodic signal generator are both adapted to provide periodic signals having a phase difference between the periodic power supply signal and the periodic input signal equal to 0, T/4 or 3T/4, T being a period of both said periodic power supply signal and said periodic input signal.

8. The testing device according to claim 1, wherein the meter is adapted to measure a current provided to the power supply input, and further comprising
    a high pass filter for filtering the current provided to the power supply input, and
    an integrator for integrating the filtered power supply current, wherein the integrated power supply current is indicative of a defective phase locked loop.

9. A phase locked loop comprising the testing device according to claim 1.

10. Method for testing a phase locked loop having a power supply input, comprising the steps:
    operating the phase locked loop in an open loop mode
    providing a power supply signal having a variation profile to the power supply input of the phase locked loop, wherein a width and height of said variation profile are formed in such a way, that the voltage controlled oscillator is prevented from outputting an oscillating output signal, and
    measuring a measurement signal of the phase locked loop, while said power supply signal is provided to the power supply input of the phase locked loop.

11. Method for testing a phase locked loop device according to claim 10, wherein said variation profile of the power supply signal has a ascending edge, said ascending edge being short enough to prevent the voltage controlled oscillator from outputting an oscillating output signal.

12. Method for testing a phase locked loop device according to claim 10, wherein said variation profile of the power supply signal has a descending edge, said descending edge being short enough to prevent the voltage controlled oscillator from outputting an oscillating output signal.

13. Method for testing a phase locked loop device according to claim 10, said phase locked loop having a phase comparator and said phase comparator having a feedback input and a reference input, wherein both said feedback input and said reference input are connected to ground.

14. Method for testing a phase locked loop device according to claim 10, wherein the phase locked loop includes a phase comparator that has a feedback input and a reference input, and wherein said feedback input and said reference input receive an identical periodic input signal.

15. Method for testing a phase locked loop device according to claim 10, wherein the measurement signal is one of a current provided to the power supply input, an output voltage of the phase locked loop and an oscillator control voltage of the phase locked loop.

16. Method for testing a phase locked loop device according to claim 10, wherein the power supply signal is a periodic voltage signal.

17. Method for testing a phase locked loop device according to claim 14, wherein the power supply signal is a periodic voltage signal, and wherein the periodic power supply signal and the periodic input signal to the reference input have the same frequency.

18. Method for testing a phase locked loop device according to claim 17, wherein a phase difference between the periodic power supply signal and the periodic input signal is equal to 0, T/4 or 3T/4, T being a period of both said periodic power supply signal and said periodic input signal.

* * * * *